United States Patent
Jäverbring et al.

(10) Patent No.: US 6,604,216 B1
(45) Date of Patent: Aug. 5, 2003

(54) TELECOMMUNICATIONS SYSTEM AND METHOD FOR SUPPORTING AN INCREMENTAL REDUNDANCY ERROR HANDLING SCHEME USING AVAILABLE GROSS RATE CHANNELS

(75) Inventors: Stefan Jäverbring, Haninge (SE); Anders Furuskär, Stockholm (SE); Stefan Eriksson, Stockholm (SE); Magnus Frodigh, Sollentuna (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/505,792

(22) Filed: Feb. 17, 2000

Related U.S. Application Data

(60) Provisional application No. 60/170,209, filed on Dec. 10, 1999.

(51) Int. Cl.[7] .............................................. H03M 13/00
(52) U.S. Cl. ...................................................... 714/751
(58) Field of Search ................................. 714/751, 752, 714/786, 748–749, 18; 375/225

(56) References Cited

U.S. PATENT DOCUMENTS

| | | | |
|---|---|---|---|
| 5,657,325 A | 8/1997 | Lou et al. | .................... 370/334 |
| 5,940,439 A | * 8/1999 | Kleider et al. | .............. 375/225 |

FOREIGN PATENT DOCUMENTS

| | | |
|---|---|---|
| DE | 196 30 343 A1 | 2/1998 |
| EP | 104703 | 10/2000 |

OTHER PUBLICATIONS

Li et al., Variable Rate rellis Coded Modulation Using Punctured Codes, IEEE, p. 624–627, 1997.*

Eroz et al., A Multiple Trellis–Coded Hybrid–ARQ Scheme for Land Mobile Communication Channels, IEEE, p. 496–500, 1995.*

*Comparison of Link Quality Control Strategies for Packet Data Services in EDGE* by Stefan Eriksson, Anders Furuskär, Mikael Höök, Stefan Jäverbring, Håkan Olofsson and Johan Sköld; Ericsson Radio Systems AB, S–164 80, Stockholm Sweden; 1999 IEEE; XP–002127832; pp. 938–942.

S. Lin, et al.; "Automatic–Repeat–Request Error–Control Schemes", *IEEE Communications*, vol. 12, Dec. 1984; pp. 5–17.

J. Hagenauer; "Rate–Compatible Punctured Convolutional Codes (RCPC Codes) and their Applications", *IEEE Transactions on Communications*, vol. 36, No. 4, Apr. 1988, pp. 389–400.

S. Kallel; "Complementary Punctured Convolutional (CPC) Codes and Their Applications", *IEEE Transactions on Communications*, vol. 43, No. 6, Jun. 1995, pp. 2005–2009.

* cited by examiner

Primary Examiner—Albert DeCady
Assistant Examiner—Shelly A Chase
(74) Attorney, Agent, or Firm—Jenkens & Gilchrist, PC

(57) ABSTRACT

A wireless communications system, transmitter, receiver and method are provided that are capable of supporting incremental redundancy error handling schemes using available gross rate channels. More specifically, the transmitter includes a coding circuit for coding a digital data block and generating a mother code word, and a reordering circuit for reordering the mother code word and generating a reordered mother code word. The transmitter also includes a modulating circuit for modulating at least one subsequence each of which has a desired number of bits taken from the reordered mother code word to fill the available bandwidth of at least one available gross rate channel. The transmitter continues to forward the modulated subsequences to the receiver until the receiver successfully decodes the digital data block.

34 Claims, 6 Drawing Sheets

TELECOMMUNICATIONS SYSTEM AND METHOD FOR SUPPORTING AN INCREMENTAL REDUNDANCY ERROR HANDLING SCHEME USING AVAILABLE GROSS RATE CHANNELS

CROSS REFERENCE TO RELATED PROVISIONAL APPLICATION

This patent application claims the benefit of priority from, and incorporates by reference the entire disclosure of co-pending U.S. Provisional Patent Application Serial No. 60/170,209 filed on Dec. 10, 1999.

BACKGROUND OF THE INVENTION

1. Technical Field of the Invention

The present invention generally relates to the telecommunications field and, in particular, to a wireless communications system and method capable of supporting an incremental redundancy error .handling scheme using available gross rate channels.

2. Description of Related Art

Wireless communication systems convey a digital data block by transmitting a modulated signal from a transmitter to a receiver over a transmission channel. Transmission channels often contain noise that tends to corrupt the transmitted signal, resulting in transmission errors and the loss of part of the transmitted data block. For instance, this noise could be interference from other transmitters. Furthermore, fading (e.g. log-normal fading, Rayleigh fading) can corrupt the transmitted channel. Corruption of the transmitted digital data block is problematic for wireless communication systems.

To minimize the impact of noise on the transmitted digital data block, various coding.techniques often referred to as Link Adaptation (LA) and Type I/II/III hybrid ARQ (Automatic Repeat-Request) schemes that make use of Forward Error Correction (FEC) and Incremental Redundancy (IR) have been proposed. Brief descriptions of a known wireless communications system 100 and how these known coding techniques are incorporated therein are discussed below with respect to FIGS. 1–3.

Referring to FIG. 1, there is illustrated a block diagram of a traditional wireless communications system 100. The traditional wireless communications system 100 includes a transmitter 120 for coding and transmitting a modulated signal, and a receiver 140 for receiving and decoding the received modulated signal. The transmitter 120 and receiver 140 include components, described below, which are selected, arranged and configured to communicate with one another over a fixed rate channel 150.

The transmitter 120 includes an information source 122, a coding circuit 124, a puncturing circuit 126 and a modulating circuit 128. The information source 122 generates a digital data block formed by a stream of bits. The coding circuit 124 codes the digital data block to form a coded data block, and a puncturing circuit 126 punctures the coded data block to produce a punctured data block. More specifically, the digital data block is coded according to a selected.code rate to provide error protection for symbols of the digital data block. And, the coded data block is punctured according to a selected deleting pattern to produce a corresponding punctured data block having erasures. The modulating circuit 128 uses the punctured data block to produce a modulated signal which is transmitted over the fixed rate channel 150.

The receiver 140 includes a demodulating circuit 142, a depuncturing circuit 144 and a decoding circuit 146. The demodulating circuit 142 demodulates the received modulated signal and outputs a demodulated signal. The demodulated signal corresponds to the punctured data block after it has been corrupted by the communication channel. The depuncturing circuit 144 uses the deleting pattern of the puncturing circuit 126 to depuncture the demodulated signal and output a depunctured data block. The decoding circuit 146 uses the code of the coding circuit 124 to decode the depunctured data block and output an estimated data block.

Referring to FIG. 2, there is a block digram illustrating in greater detail the coding, puncturing and modulating of a digital data block in the traditional wireless communications system 100 according to the FEC coding technique. In the LA coding technique, Modulation and Coding Schemes (MCS) are selected based on link quality measurements. For example, the GPRS (General Packet Radio Service) standard uses GMSK (Gaussian Minimum Shift Keying) modulation and allows the use of four different Coding Schemes (CS) i.e. CS-1 through CS-4 with coding rates ½, ⅔, ¾, and 1 respectively. An example of Logical Link Control (LLC) frame segmentation in GPRS is depicted in FIG. 2. A frame 202 is segmented into digital data blocks 204 (one shown) having a header H1 and a Frame Check Sequence (FCS). The digital data block 204 is coded with a convolutional code rate ½ (for example) to form a coded data block 206 and then punctured (if needed) to form a punctured data block 208. It should be noted that a single puncturing pattern (e.g., puncturing pattern P1) is used for a given coding scheme because there is one-to-one relation between the data block 204 and the resulting punctured data block 208. Thereafter, the punctured data block 208 is modulated and transmitted to the receiver 140 over the fixed rate channel 150.

Referring to FIG. 3, there is a block diagram illustrating in greater detail the coding, puncturing and modulating of a digital data block in the traditional wireless communications system 100 according to the Type II hybrid ARQ coding techniques. Basically, the ARQ coding techniques are link level techniques that can provide low bit error rates by effectively retransmitting modulated signals to the receiver 140. In other words, the ARQ coding technique uses at least one fixed rate channel 150a, 150b. . . 150n to support the retransmission of a modulated signal. The ARQ coding techniques can be divided into fixed redundancy and variable redundancy error control schemes. The Type I hybrid ARQ coding technique is essentially a fixed redundancy error control scheme. And, the Type II hybrid ARQ coding technique is based on a variable redundancy control scheme. The LA coding technique of FIG. 1 can be viewed as using a set of Type I hybrid ARQ coding techniques.

In the Type II hybrid ARQ coding technique shown in FIG. 3, data redundancy or retransmission of modulated signals which are not necessarily the same signals is continued until the receiver 140 successfully decodes a digital data block 304. As shown:, the digital data block 304 (shown on left) is coded using a predetermined code (e.g., systematic convolutional code) to form a mother code word 306 (shown on left). The mother code word 306 (shown on left) is punctured using a predetermined puncturing pattern P1 to form a subblock 308a. The subblock 308a is then modulated and transmitted to the receiver 140 over a first fixed rate channel 150a. If the receiver 140 is able to successfully decode the digital data block 304 then an acknowledgment signal 360 is sent to the transmitter 120 and the next digital data block (not shown) is transmitted to the receiver 140. In the event the receiver 140 is not able to successfully decode the digital data block 304, then a retransmission request, signal 362 is sent to the transmitter 120.

Upon receiving the retransmission request signal 362, the transmitter 120 operates again to code the digital data block 304 (shown in middle) using the predetermined code to form the mother code word 306 (shown in middle). The mother code word 306 (shown in middle) is punctured using another predetermined puncturing pattern P2 to form a subblock 308b. The subblock 308b which may not have the same bits as subblock 308a is modulated.and transmitted to the receiver 140 over a second fixed rate channel 150b. If the receiver 140 is now able to successfully decode the digital data block 304 also using information from previously received subblocks in joint decoding then an acknowledgment signal 360 is sent to the transmitter 120 and the next digital data block (not shown) is transmitted to the receiver 140. In the event the receiver 140 is still not able, to successfully decode the digital data block 304, then another retransmission request signal 362 is sent to the transmitter 120.

Upon receiving the retransmission request signal 362, the transmitter 120 yet again operates to code the digital data block 304 (shown on right) using the predetermined code to form the mother code word 306 (shown on right). The mother code word 306 (shown on right) is punctured using another predetermined puncturing pattern Pn to form a subblock 308n. It should be understood that the number "n" of subblocks is arbitrary, i.e., that the subblock 308n does not necessarily come after subblock 308b. The subblock 308n is modulated and transmitted to the receiver 140 over another fixed rate channel 150n. If the receiver 140 is still not able to successfully decode the digital data block 304 then this process of coding, puncturing, modulating and transmitting the digital data block 304 is repeated until the receiver 140 successfully decodes the digital data block 304 and forwards the acknowledgment signal 360 to the transmitter 120.

A description about the Type II hybrid ARQ coding technique can be found in: (1) S. Lin, D. J. Costello, "Automatic Repeat-Request Error Control Schemes"; IEEE Commun. Mag., vol. 12, pp. 5–17, December 1984; and (2) J. Hagenauer, "Rate-Compatible Punctured Convolutional Codes (RCPC Codes) and their Applications", IEEE Trans. Comm., vol. 36, no. 4, April 1988. Both of these articles are hereby incorporated into the present application.

The Type III Hybrid ARQ coding technique is a special form of the Type II Hybrid PRQ coding technique, where all the subblocks have certain properties. A description about the Type III hybrid ARQ coding technique can be found in S. Kallel, "Complementary Punctured Convoluntional (CPC) Codes and Their Application", IEEE transactions on-communications, vol. 43, no. 6, June 1995. However, it should be understood that both Type II and Type III Hybrid ARQ coding techniques can be designed so that decoding of single sub-blocks themselves is possible. Both the Type II Hybrid ARQ and Type III Hybrid ARQ coding techniques are referred to as Incremental Redundancy (IR) hereinafter. Unfortunately, the traditional wireless communications system 100 that use fixed rate channels 150a, 150b . . . 150n have several disadvantages. For instance, some of the disadvantages are as follows:

1. No good solution using incremental redundancy over available gross rate channels exists. Since the subblocks 308a, 308b . . . 308n are of equal or fixed sizes, they are not suitable for transmission over available gross rate channels. One problematic solution is to have very small subblocks, and hence one would be able to fit different numbers of these subblocks oh the available gross rate channel. However, this causes much overhead, since each subblock normally contains a header.
2. No flexible way of designing and utilizing incremental redundancy code words exists. Current methods require one puncturing pattern for each subblock. If many different subblocks (e.g., of different lengths) are needed to cope with available gross rate channels, then as many puncturing patterns are needed. This causes high complexity. Additionally, the signaling of which puncturing pattern that has been used gives a large overhead.
3. No flexible way of signaling which puncturing pattern P1, P2 . . . Pn is used exists. Normally a number of predetermined puncturing schemes, i.e. bitmaps containing one's and zero's are applied, and which puncturing scheme is used is signaled to the receiver 120 in the subblock header.

Accordingly, there is a need for a wireless communications system and method that addresses the aforementioned problems of the traditional wireless communications system by supporting incremental redundancy error handling schemes using available gross rate channels. This need and other needs are satisfied by the wireless communications system, transmitter, receiver and method of the present invention.

DESCRIPTION OF THE INVENTION

The present invention is a wireless communications system, transmitter, receiver and method that addresses the deficiencies of the prior art by supporting incremental redundancy error handling schemes using available gross rate channels. More specifically, the transmitter includes a coding circuit for coding a digital data block and generating a mother code word, and a reordering circuit for reordering the mother code word and generating a reordered mother code word. The transmitter also includes a subsequence selection circuit for selecting at least one subsequence from the reordered mother code word, and a modulating circuit for modulating and forwarding at least one subsequence to the receiver. Each subsequence has desired number of bits, taken from the reordered mother code word, to fill the available bandwidth of at least one available gross bitrate channel. The transmitter continues to forward and modulate subsequences of the reordered mother code word until the receiver successfully decodes the digital data block.

BRIEF DESCRIPTION OF THE DRAWINGS

A more complete understanding of the method and apparatus of the present invention may be had by reference to the following detailed description when taken in conjunction with the accompanying drawings wherein.

DETAILED DESCRIPTION OF THE DRAWINGS

Figure 4:
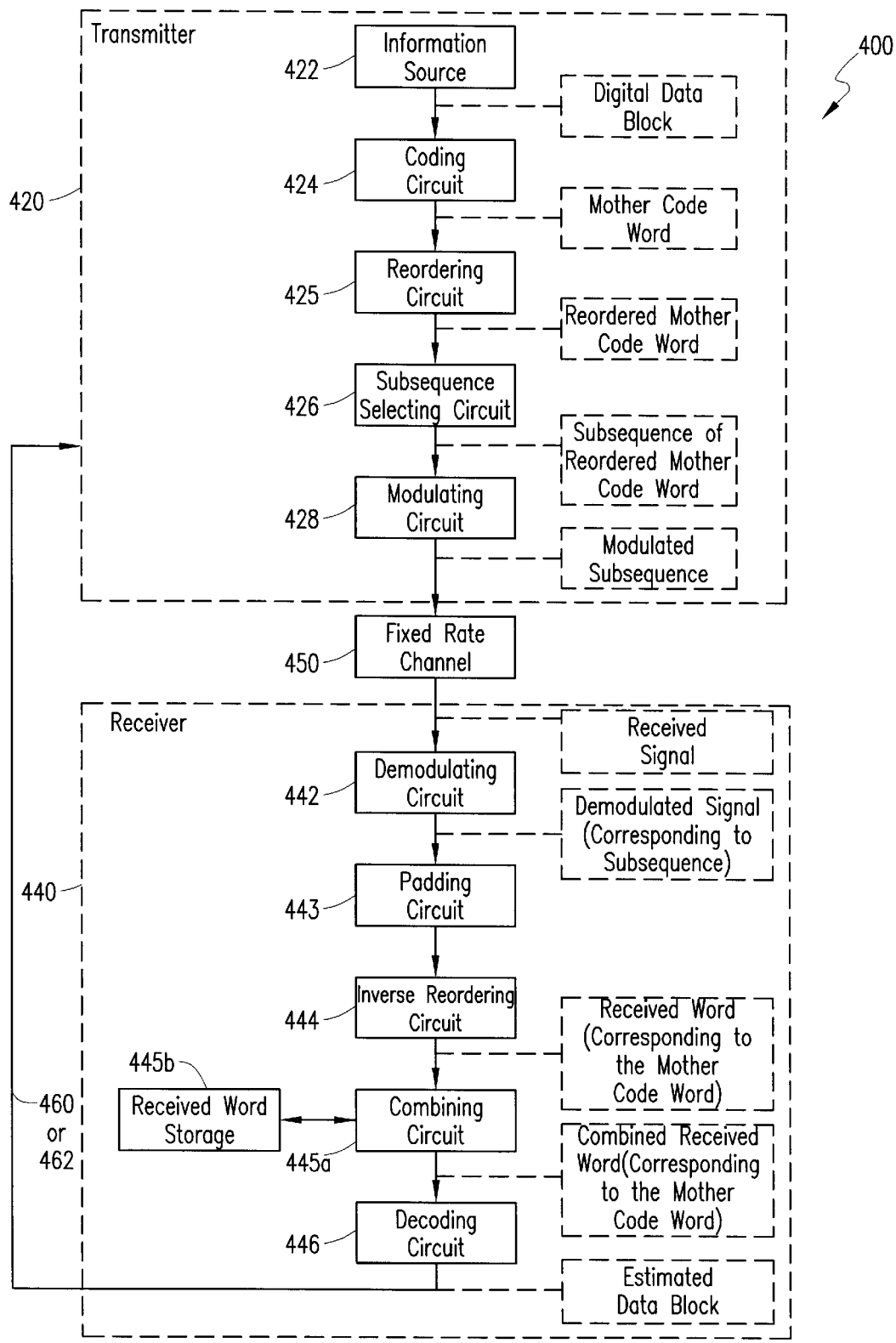
FIG. 4 is a block diagram illustrating the basic components of the wireless communications system in accordance with the present invention.
Figure 5:
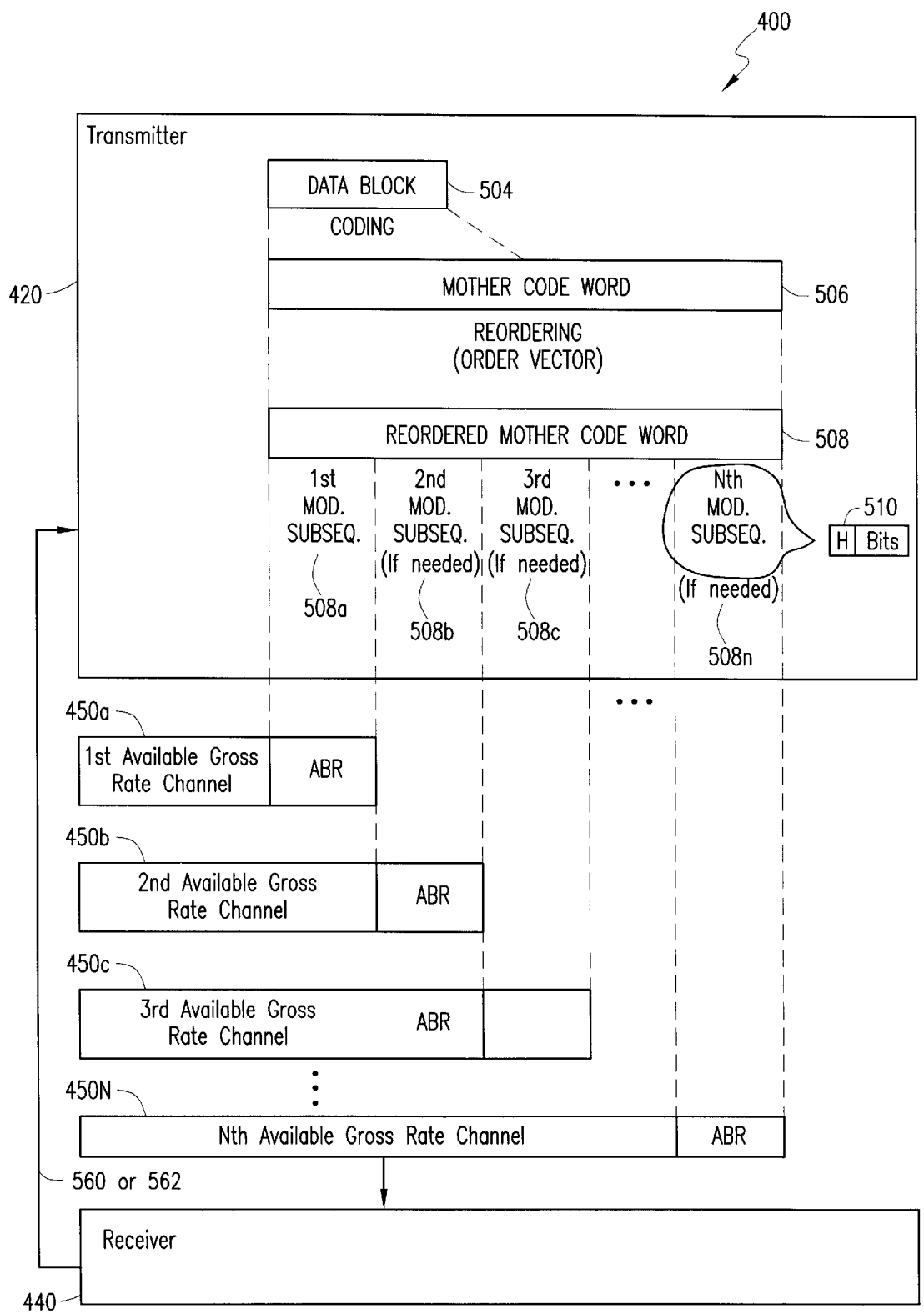
FIG. 5 is a block diagram illustrating in greater detail the wireless communications system of FIG. 4 using an incremental redundancy coding technique.
Figure 6:
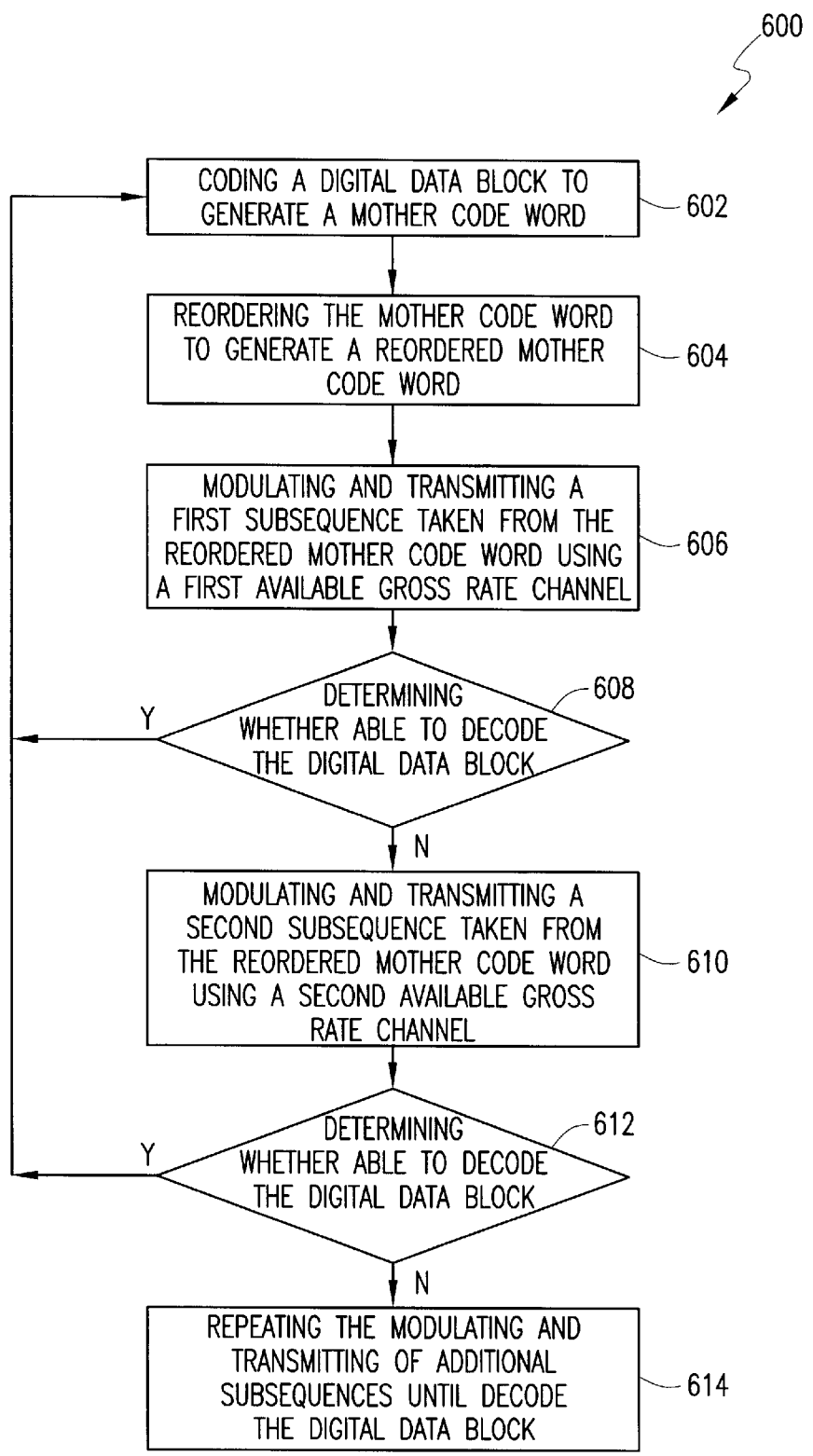
FIG. 6 is a flowchart illustrating the basic steps of the preferred method in accordance with the present invention.

Referring to the Drawings, wherein like numerals represent like parts throughout FIGS. 4–6, there are disclosed an exemplary wireless communications system 400 and preferred method 600 in accordance with the present invention.

Although the wireless communications system 400 is described with reference to the Global System for Mobile Communications/(Enhanced) General Packet Radio Services-Global System for Mobile Communications/ Enhanced Data Global System for Mobile Communications Evolution Radio Access Network (GSM/ (E) GPRS-GRAN) standards, those skilled in the art will appreciate that other standards and specifications including, for example, other third generation standards may also utilize the principles of the present invention. Accordingly, the wireless communications system 400 and preferred method 600 described should not be construed in a limited manner.

Figure 1:
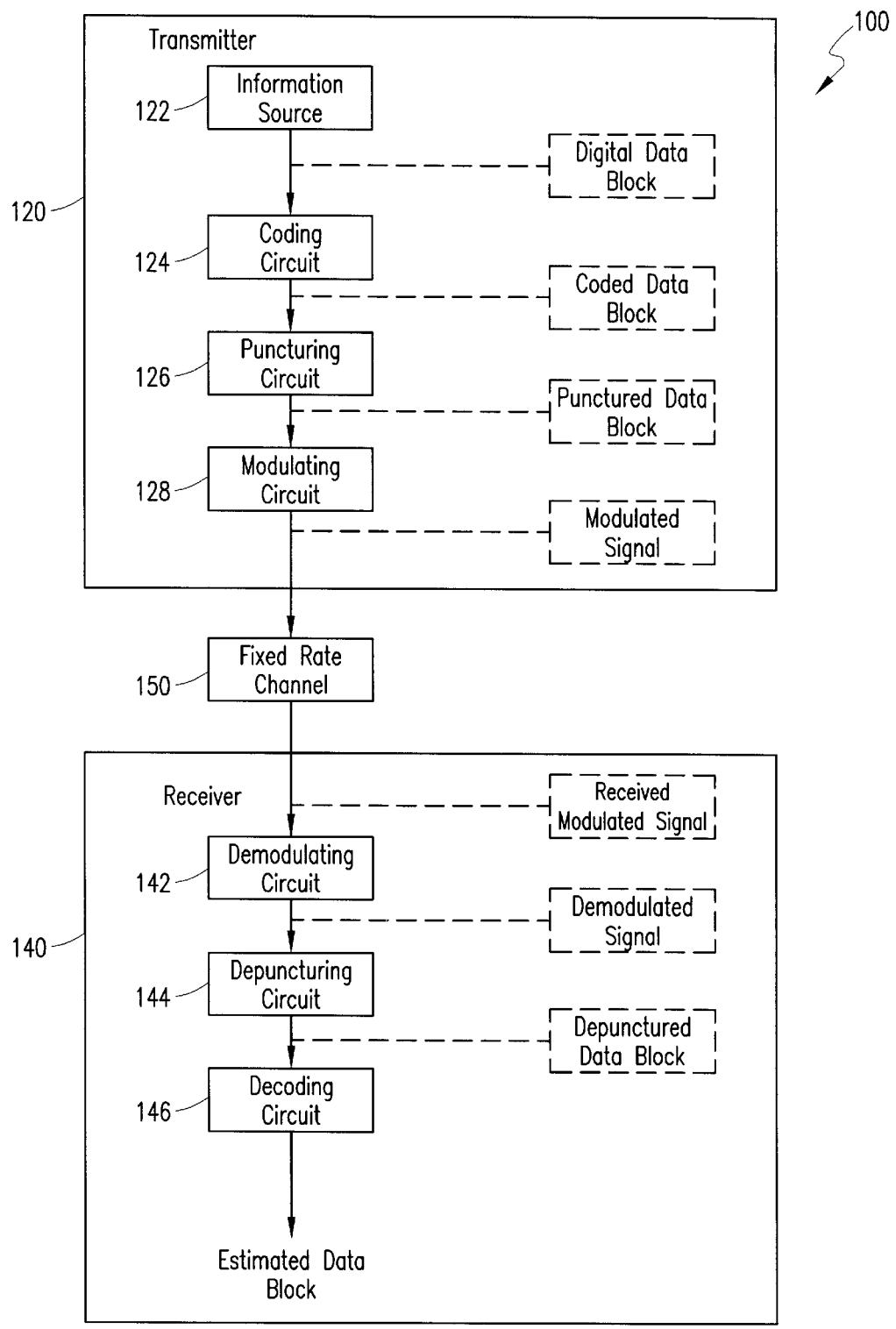
FIG. 1, prior art, is a block diagram illustrating a traditional wireless communications system.
Figure 2:
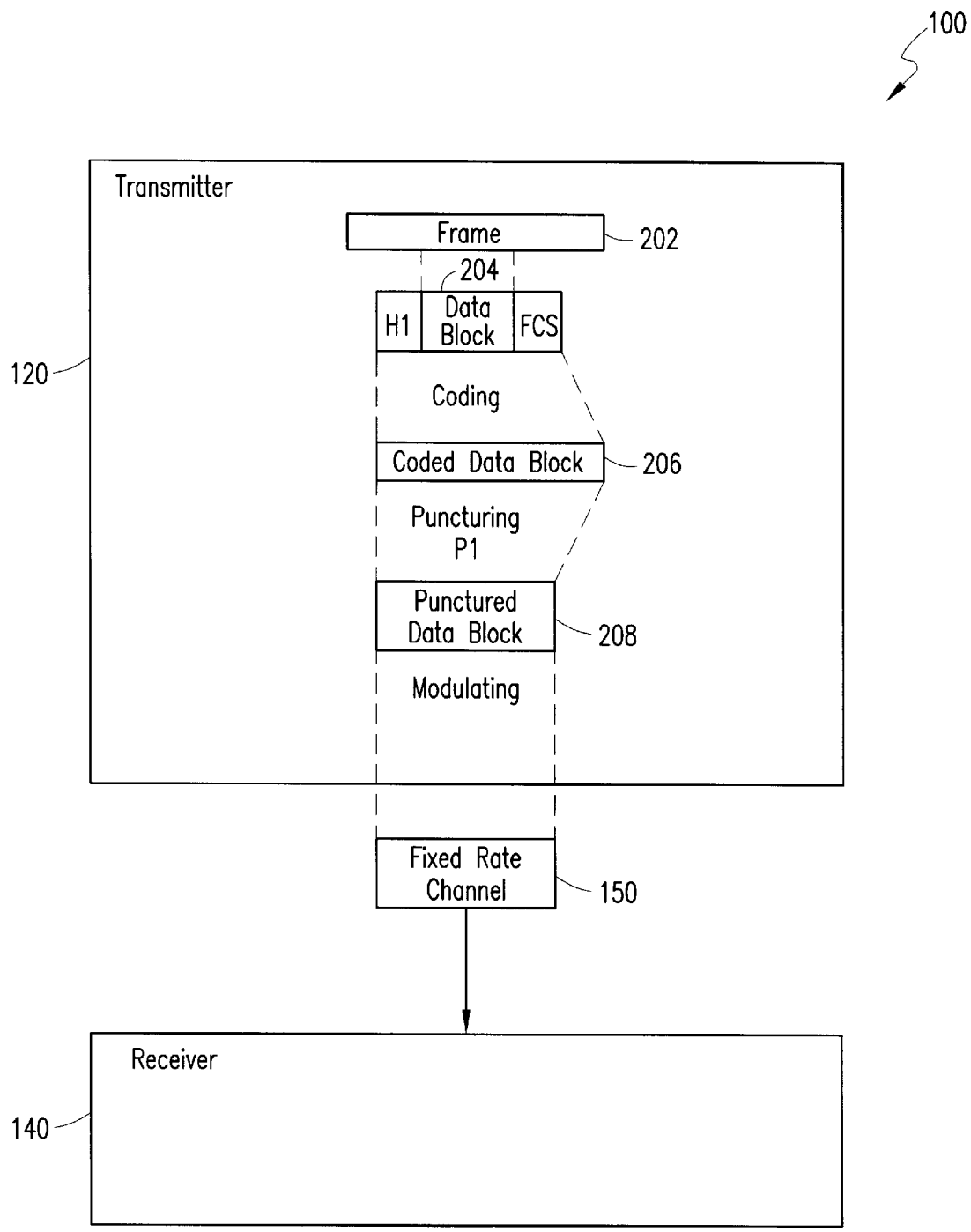
FIG. 2, prior art, is a block diagram illustrating in greater detail the traditional wireless communications system of FIG. 1 using a forward error correction (FEC) coding technique.

Referring to FIG. 4, there is a block diagram illustrating the basic components of the wireless communications system 400 in accordance with the present invention. The wireless communications system 400 is similar to the traditional wireless communications system 100 of FIG. 1, except that the wireless communications system 400 is capable of effectively supporting incremental redundancy error handling schemes (e.g., Type II/III hybrid ARQ coding techniques) using the available,;bandwidth of available gross rate channel(s).

The wireless communications system 400 includes a transmitter 420 for coding and transmitting a .modulated signal (shown as modulated subsequence), and a receiver 440 for receiving and decoding a received signal. The transmitter 420 and receiver 440 may be any communication device that communicates over at least one available gross rate channel 450 including a cordless or cellular mobile phone, two way radio, MODEM (modulator-demodulator), radio, base station, or the like.

The transmitter 420 includes an information source 422, a coding circuit 424, a reordering circuit 425, a subsequence selecting circuit 426 and a modulating circuit 428. The information source 422 generates a digital data block formed by a stream of bits. The coding circuit 424 codes the digital data block to form a mother code word. More specifically, the digital data block is coded according to a selected code rate to provide error protection for symbols of the digital data block. The mother code word is reordered by the reordering circuit 425 using an ordering vector (described below) to produce a reordered mother code word. The subsequence selecting circuit 426 then selects enough bits (known as a subsequence) from the reordered mother code word to fill all or most of the available bandwidth of an available gross rate channel 450. Thereafter, the modulating circuit 428 uses the subsequence to produce and transmit a 10 modulated subsequence using the available bandwidth of the available gross rate channel 450 (see FIG. 5 for a detailed description about multiple transmissions of modulated subsequences).

The receiver 440 includes a demodulating circuit 442, a padding circuit 443, an inverse reordering circuit 444, a combining circuit 445*a* (attached to a storage unit 445*b*) and a decoding circuit 446. The demodulating circuit 442 demodulates one received modulated signal and outputs a demodulated signal. The demodulated signal corresponds to the subsequence of the reordered mother code word after it has been corrupted by the noise in the available gross rate channel 450. The padding circuit 443 an inverse reordering circuit 444 use the demodulated signal to generate a received word corresponding to the mother code word. More specifically, the padding circuit 443 and inverse reordering circuit 444 use the ordering vector (described below) to pad and reorder the demodulated signal and output the received word. The combining circuit 445*a* combines the received word (corresponding to the mother code word) with previously received information stored in the storage unit 445*b* and outputs a combined received word (corresponding to the mother code word). Thereafter, if the receiver 440 is able to successfully decode the combined received word using the decoding circuit 446, then an acknowledgment signal 460 is sent to the transmitter 440 which transmits the next digital data block. Otherwise, if the receiver 440 is not able to successfully decode the combined received word using the decoding circuit 446, then a retransmission request signal 462 is sent to the transmitter 420 which forwards another modulated subsequence to the receiver 440. A more detailed discussion about the reordering of the mother code word and the selecting and modulating of multiple subsequences of the reordered mother code word's provided below with respect to FIG. 5.

Figure 3:
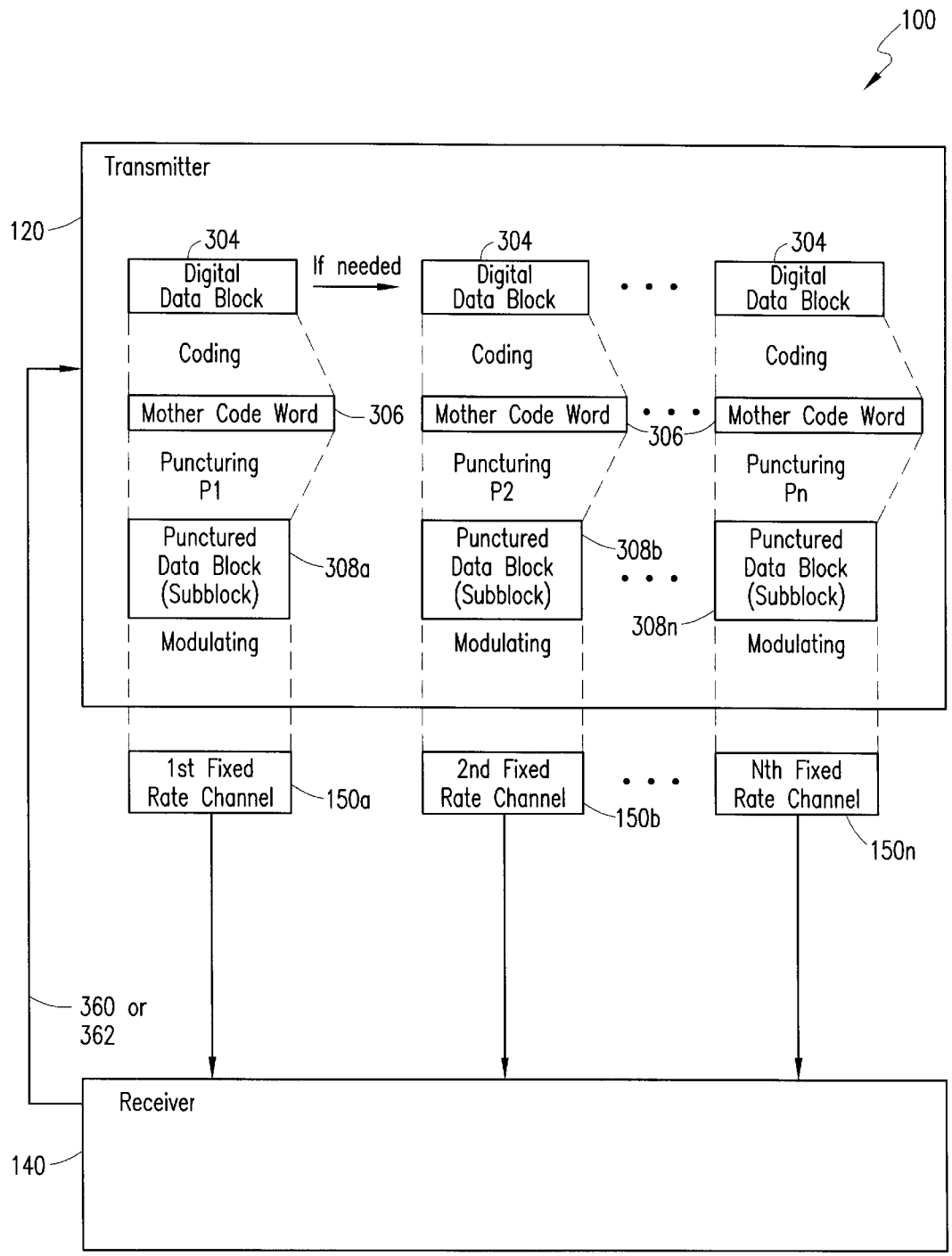
FIG. 3, prior art, is a block diagram illustrating in greater detail the traditional wireless communications system of FIG. 1 using a Incremental Redundancy (IR) coding technique;.

Referring to FIG. 5, there is a block diagram illustrating in greater detail the wireless communications system 400 of the present invention. Basically, the wireless communications system 400 enables the transmission of a modulated subsequence and, if needed, subsequent transmissions of additional modulated subsequences each of which is sized to effectively use the available bandwidth in available gross rate channels 450*a*, 450*b*, 450*c* . . . 450*n*. Compare this with the traditional wireless communications system 100 which supports the transmission and retransmission of modulated subblocks 308*a*, 308*b* . . . 308*n* each of which have the same size so as to fit in fixed rate channels 150*a*, 150*b* . . . 150*n* (see FIG. 3).

As shown, a data block 504 is coded using a predetermined code (e.g., a systematic convoluntional code) to form a mother code word 506. The mother code word is reordered to form a reordered mother code word 508. The reordered mother code word 508 is based on an ordering vector that defines the order in which bits forming each subsequence 508*a*, 508*b*, 508*c* . . . 508*n* are modulated and forwarded to the receiver 440.

For example, different puncturing patterns P1, P2, P3 . . . Pn may be used in sequence to reorder and form the reordered mother code word 508. Whereas, in the prior art different puncturing patterns P1, P2 . . . Pn (all different) would be used separately to puncture each mother code word 306 (all the same) and form different subblocks 308*a*, 308*b* . . . 308*n* (see FIG. 3). Exemplary puncturing patterns P1, P2 and P3 are given below:

P1=[100100100100100100 . . . 100]
P2=[010010010010010010 . . . 010]
P3=[001001001001001001 . . . 001]

In the prior art, the subblock 308*a* would contain the bits in positions 1,4,7,10, . . . of the mother code word 306, since the puncturing pattern P1 has ones in these positions. Similarly, the subblock 308*b* would contain the bits in positions 2,5,8,11, . . . of the mother code word 306, and the subblock 308*c* (not shown) would contain the bits in positions 3,6,9,12 . . . of the mother code word 306. These subblocks 308*a*, 308*b* and 308*c* are sequentially sent to the receiver 120 until the receiver successfully decodes the digital data block 304.

In the preferred embodiment of the present invention, the mother code word 506 is sequentially punctured using one or more puncturing patterns P1, P2, P3 . . . Pn that together form the ordering vector. An exemplary ordering vector is given below:

O=[1,4,7,10, . . . ,2,5,8,11, . . . ,3,6,9,12, . . . ]

The ordering vector defines the order in which the bits forming the reordered mother code word 508 are to be modulated and transmitted to the receiver 420, which also knows the ordering vector. Basically, the transmitter 420 can start and stop as needed within the reordered mother code word 508 to create subsequences 508a, 508b, 508c . . . 508n each of which has a desired number of bits so that they can fit within the available bandwidth ABR of the available gross rate channels 450a, 450b, 450c . . . 450n. This enables IR transmission on available gross rate channels.

Referring back to the reordered mother code word 508 shown in FIG. 5, a first subsequence 508a taken from a first sequence of bits in the reordered mother code word 508 is modulated and transmitted to the receiver 440 using the available bandwidth ABR of the first available gross rate channel 550a. Again, the first subsequence 508a has a desired number of bits so that it can fit within the available bandwidth ABR of the first available gross rate channel 550a. If the receiver 440 is able to successfully decode the first subsequence 508a and estimate the digital data block 504, then an acknowledgment signal 560 is sent to the transmitter 420 and the next data block (not shown) is transmitted to the receiver 440 using the principles of the present invention. If the receiver 440 is not able to successfully decode the first subsequence 508a and estimate the digital data block 504 then, a retransmission request signal 562 is sent to the transmitter 420.

Upon receiving the retransmission request signal 562, the transmitter 420 operates to modulate a second subsequence 508b using a second sequence of bits taken from the reordered mother code word 508. The second sequence of bits can be adjacent to the first sequence of bits associated with the first subsequence 508a. Again, the second subsequence 508b has a desired number of bits so that it can fit within the available bandwidth ABR of the second available gross rate channel 550b. The transmitter 420 then transmits the modulated second subsequence 508b to the receiver 440 using the available bandwidth ABR of the second available gross rate channel 550b. If the receiver 440 after decoding the first and second subsequences 508a and 508b is able to estimate the digital data block 504, then an acknowledgment signal 560 is sent to the.transmitter 520 and the next digital data block (not shown) is transmitted to the receiver 440 using the principles of the present invention. If the receiver 440 is not able to successfully decode the second subsequence 508b and estimate the digital data block 502, then the receiver 440 sends another retransmission request signal 562 to the transmitter 420.

Upon receiving the second retransmission request signal 562, The transmitter 520 operates to modulate a third subsequence 508c using a third sequence of bits taken from the reordered mother code word 508. The third sequence of bits can be adjacent to the second sequence of bits associated with the second subsequence 508b. Again, the third subsequence 508c has a desired number of bits so that it can fit within the available bandwidth ABR of the third available gross rate channel 550c. The transmitter 420 then transmits the modulated third subsequence 508c to the receiver 440 using the available bandwidth ABR of the third available gross rate channel 550c. If the receiver 440 after decoding the first, second and third subsequences 508a, 508b and 508c is able to estimate the digital data block 504, then an acknowledgment signal 560 is sent to the transmitter 420 and the next digital data block (not shown) is transmitted to the receiver 440 using the principles of the present invention. If the receiver 440 is still not able to successfully estimate the digital data block 504, then the transmitter 440 operates to repeat the process of modulating and forwarding of additional subsequences 508n taken from additional sequences of bits in the reordered mother code word 508 until the receiver successfully estimates the digital data block 504.

Each subsequence 508a, 508b, 508c . . . 508n may include a header 510 indicating a starting point or starting bit in the reordered mother code word 508 and a length of the particular modulated subsequencing. However, the header 510 may not need to include the length of the modulated subsequence 508a, 508b, 508c or 508n, if the receiver 440 can automatically assume that the available bandwidth ABR of the available gross rate channels 550a, 550b, 550c . . . 550n are "filled out" with the respective subsequence 508a, 508b, 508c . . . 508n. In addition, the starting point need not be included either if it can be derived some other way, e.g., if the receiver can keep track of exactly how many bits that have been sent so far (if transmitted blocks can disappear on the channel, this may not be the case though).

It should also be understood that the available bandwidths ABRs of the different available gross rate channels 550a, 550b, 550c . . . 550n can be and are often different lengths. As such, the transmitter 440 may initially send one or more subsequences 508a and 508b (for example) resulting in a combined code rate higher than some threshold rate R, e.g., R=1. This means that even very small available bandwidths ABRs of the available gross rate channel(s) 550a, 550b, 550c . . . 550n can be utilized. Of course, decoding of only the subsequences 508a and 508b (for example) with a combined code rate higher than 1 will likely fail, but it can still be used in combination with other subsequences 508a, 508b and 508c (for example) if the combined code rate together provide an equivalent code rate <=1.

Moreover; the transmitter 420 may be designed such that it transmits new subsequences 508b, 508c . . . 508n (for example) until the equivalent code rate reaches a predetermined threshold such as an equivalent code rate of 1, without awaiting acknowledgments from the receiver 440. In other words, the transmitter 420 can forward a series of modulated subsequences 508a, 508b, 508c . . . 508n to the receiver 440 even when the transmitter fails to receive an acknowledgment signal 560 from the receiver. This scheme may reduce delays and memory requirements. Alternatively, the transmitter 420 can be designed to transmit a new subsequence 508b, 508c . . . 508n only after it has received an acknowledgment signal 560 from the receiver 440.

Referring to FIG. 6, there is a flowchart illustrating the basic steps of the preferred method 600 that supports an incremental redundancy error handling scheme by mapping the available bandwidth ABR of available gross rate channels 550a, 550b, 550c . . . 550n. Beginning at step 602, a digital data block 504 is coded by a predetermined coding rate to generate a mother code word 506. At step 604, the mother code word 504 is reordered using, for example, at least one puncture pattern P1, P2, P3 . . . Pn to generate a reordered mother code word 508. As described above, the reordered code mother word 508 is based on an ordering vector that defines the order in which bits forming each subsequence 508a, 508b, 508c . . . 508n are modulated and forwarded to the receiver 440. And, the ordering vector is based on the one or more puncturing patterns P1, P2, P3 . . . Pn.

At step 606, a first subsequence 508a taken from a first sequence of bits (e.g., starting from the leftmost value) in the reordered mother code word 508 is modulated and transmitted to the receiver 440 using the available bandwidth ABR of the first available gross rate channel 550a. Again, the first subsequence 508a is sized to fit within the available bandwidth ABR of the first available gross rate channel 550a.

At step 612, a determination is made as to whether the receiver 440 is able to successfully decode the first subsequence 508a and estimate the digital data block 504. If yes, the receiver 440 sends an acknowledgment signal 560 to the transmitter 420 which then transmits a new digital data block to the receiver 440 (go back to step 602).

Otherwise, at step 610, the receiver 440 sends a retransmission request signal 562 to the transmitter. 420, which then transmits a second subsequence 508b that is sized to use the available bandwidth ABR of a second available gross rate channel 550b. The second subsequence 508b uses a second sequence of bits preferably starting from where the first subsequence 508 stopped in the reordered mother code word 508.

At step 612, a determination is made as to whether the receiver 440 is able to successfully decode the second subsequence 508b and estimate the digital data block 504. In fact, the receiver 440 may use the second subsequence 508b alone or both the first and second subsequences 508a and 508b to estimate the digital data block 504. If the receiver is able to estimate the digital data block 504, then the receiver 440 sends an acknowledgment signal 560 to the transmitter 420, which then transmits a new digital data block to the receiver 440 (go back to step 602).

Otherwise, at step 614, the receiver 440 sends another retransmission request signal 562 to the transmitter 520, which then operates to repeat the process of modulating and forwarding of additional subsequences 508c . . . 508n taken from additional sequences of bits in the reordered mother code word 508 until the receiver successfully estimates the digital data block 504. After estimating the digital data block 502, the receiver 440 sends an acknowledgment signal 560 to the transmitter 520, which then transmits a new digital data block to the receiver 440.

It should be understood that different methods of the IR coding technique exist and can be used with the present invention. For instance, the stop and wait scheme wherein one digital data block at a time must be correctly received before the transmitter goes on with the next digital data block. The go back n scheme wherein the transmitter keeps on sending new digital data blocks and when some block is NACKed (not acknowledged), then the transmitter retransmits that block and all subsequent blocks. Due to delay in the NACK, this can mean retransmitting several blocks apart from the NACKed block, even if they are not erroneous. The selective repeat scheme wherein the transmitter keeps on sending new digital data blocks and when some block(s) is NACKed, thereafter the transmitter retransmits that block(s) and then resumes transmitting new digital data blocks. This application describes the stop and wait method. However, the present invention works equally well for the other methods too. It should be also understood that the "bit ordering scheme" of the present invention may also be used to flexibly obtain arbitrary code rates for LA schemes on variable rate, i.e., the transmitter controls the occupied bit rate channels. More specifically, the digital data block is encoded and reordered according to the present invention. In a well known manner a suitable code rate is chosen (e.g., based on estimates of channel quality and/or quality of service requirements). Then, as many bits as is needed to obtain the subsequence are transmitted from the reordered mother code word. For retransmission if employed, the same number of bits if the same code rate is desired, more or fewer bits if not, are taken from the same ordering vector (e.g., from the beginning of the vector) and transmitted to the receiver. Hence, the number of transmitted bits can vary, but the number of bits are decided based on the wanted code rate. This could be a first stream on a physical bearer, a best effort service based on "IR on variable bitrate channels" can fill out the remaining part of the bearer.

From the foregoing, it can be readily appreciated by those skilled in the art that the present invention addresses the deficiencies of the prior art by providing a wireless communications system capable of supporting various incremental redundancy error handling schemes using available gross rate channels. Basically, the wireless communications system of the present invention enables the transmission of a modulated subsequence and, if need, subsequent transmissions of additional modulated subsequences each of which can be sized to effectively use the available bandwidth in available gross rate channels.

Although one embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A transmitter for transmitting a digital data block to a receiver, said transmitter comprising:

a coding circuit for coding the digital data block and generating a mother code word;

a reordering circuit for reordering the mother code word and generating a reordered mother code word, wherein the reordered mother code word is generated based on an ordering vector, the ordering vector defining an order in which bits forming the reordered mother code word are to be modulated and forwarded to a receiver; and a modulating circuit for modulating at least one subsequence and for forwarding, to the receiver, the at least one modulated subsequence, each of the at least one modulated subsequence having a desired number of bits taken from the reordered mother code word to fill the available bandwidth of at least one available gross rate channel.

2. The transmitter of claim 1, wherein said ordering vector is based on at least one puncturing pattern, each of the at least one puncturing pattern being used to reorder the mother code word.

3. The transmitter of claim 1, wherein said receiver knows the ordering vector.

4. The transmitter of claim 1, wherein each modulated subsequence includes a header indicating a starting point in the reordered mother code word.

5. The transmitter of claim 1, wherein each modulated subsequence includes a header indicating a starting point in the reordered mother code word and a length of the modulated subsequence.

6. The transmitter of claim 1, wherein said modulating circuit is capable of forwarding a plurality of the modulated subsequences to the receiver until an equivalent code rate is less than a predetermined threshold rate R.

7. The transmitter of claim 6, wherein said predetermined threshold rate R is one.

8. The transmitter of claim 1, wherein said modulating circuit is capable of forwarding a plurality of the modulated subsequences to the receiver even when said transmitter fails to receive an acknowledgment signal from the receiver.

9. The transmitter of claim 1, wherein said modulating circuit is capable of forwarding one of the modulated subsequences only after said transmitter receives an acknowledgment signal from the receiver.

10. The transmitter of claim 1, wherein said transmitter is a mobile terminal or is incorporated within a wireless communications system.

11. A transmitter for supporting an error handling scheme using at least one available gross rate channel, said transmitter comprising:
- a coding circuit for coding a digital data block and generating a mother code word,
- a reordering circuit for reordering the mother code word and generating a reordered mother code word, wherein the reordered mother code word is generated based on an ordering vector, the ordering vector defining an order in which bits forming the reordered mother code word are to be modulated and forwarded to a receiver; and
- a modulating circuit for modulating a subsequence taken from a first sequence of bits in the reordered mother code word and for forwarding the modulated first subsequence to the receiver using the available bandwidth of a first available gross rate channel, said modulating circuit being further capable of repeating the process of modulating and forwarding other subsequences taken from the reordered mother code word until the receiver successfully decodes the digital data block.

12. The transmitter of claim 11, wherein said error handling scheme is an incremental redundancy error handling scheme.

13. The transmitter of claim 12, wherein said incremental redundancy error handling scheme is further classified as a Type II hybrid ARQ (Automatic Repeat Request) scheme or a Type III hybrid ARQ scheme.

14. The transmitter of claim 11, wherein said ordering vector is based on at least one puncturing pattern, each of the at least one puncturing pattern being used to reorder the mother code word.

15. The transmitter of claim 11, wherein each modulated subsequence includes a header indicating a starting point in the reordered mother code word.

16. The transmitter of claim 11, wherein each modulated subsequence includes a header indicating a starting point in the reordered mother code word and a length of the modulated subsequence.

17. The transmitter of claim 11, wherein said modulating circuit is capable of forwarding a plurality of the modulated subsequences to the receiver until an equivalent code rate is less than a predetermined threshold rate R.

18. The transmitter of claim 17, wherein said predetermined threshold rate R is one.

19. A method for supporting an incremental redundancy error handling scheme using at least one available gross rate channel, said method comprising the steps of:
- coding a digital data block to generate a mother code word;
- reordering the mother code word to generate a reordered mother code word, wherein the reordered mother code word is generated based on an ordering vector, the ordering vector defining an order in which bits forming the reordered mother code word are to be modulated and forwarded to a receiver; and
- modulating at least one subsequence from the reordered mother code word and forwarding the at least one modulated subsequence to the receiver using the available bandwidth of the at least one available gross rate channel.

20. The method of claim 19, wherein said steps of modulating and forwarding further include the steps of:
- modulating a first subsequence taken from a first sequence of bits in the reordered mother code word and forwarding the modulated first subsequence to the receiver in a first available gross rate channel;
- modulating a second subsequence taken from a second sequence of bits in the reordered mother code word and forwarding the modulated second subsequence word to the receiver in a second available gross rate channel; and
- modulating and forwarding additional subsequences taken from additional sequences of bits in the reordered mother code word until the receiver successfully decodes the digital data block.

21. The method of claim 19, wherein said ordering vector is based on a plurality of puncturing patterns.

22. The method of claim 19, wherein said steps of modulating and forwarding further include the step of forwarding a plurality of the modulated subsequences to the receiver until an equivalent code rate is less than a predetermined threshold rate R.

23. The method of claim 22, wherein said predetermined threshold rate R is one.

24. The method of claim 19, wherein said steps of modulating and forwarding further include the step of forwarding a plurality of the modulated subsequence to the receiver even when said transmitter fails to receive an acknowledgment signal from the receiver.

25. The method of claim 19, wherein said steps of modulating and forwarding further include the step of forwarding one of the modulated subsequences only after said transmitter receives an acknowledgment signal from the receiver.

26. The method of claim 19, wherein each modulated subsequence includes a header indicating a starting point in the reordered mother code word.

27. The method of claim 19, wherein each modulated subsequence includes a header indicating a starting point in the reordered mother code word and a length of the modulated subsequence.

28. The method of claim 19, wherein said transmitter is a mobile terminal or is incorporated within a wireless communications system.

29. The method of claim 19, wherein said receiver is a mobile terminal or is incorporated within a wireless communications system.

30. A wireless communications system comprising:
- a receiver;
- a transmitter operatively coupled to said receiver, said transmitter including:
  - a coding circuit for coding a digital data block and generating a mother code word;
  - a reordering circuit for reordering the mother code word and generating a reordered mother code word, wherein the mother code word is reordered based on an ordering vector, the ordering vector defining an order in which bits forming the reordered mother code word are to be modulated and forwarded to the receiver; and a modulating circuit for modulating a first subsequence taken from a first sequence of bits in the reordered mother code word and forwarding the modulated first subsequence to the receiver in the available bandwidth of a first available gross rate channel, said modulating circuit being further capable of modulating a second subsequence taken from a second sequence of bits in the reordered mother code word and forwarding the modulated second subsequence to the receiver in the available bandwidth of a second available gross rate channel, said modulating circuit also being capable of repeating the process of modulating and forwarding additional subsequences taken from additional sequences of bits in the reordered mother code word until the receiver successfully decodes the digital data block.

31. The wireless communications system of claim 30, wherein said transmitter is capable of forwarding a plurality of the modulated subsequences to the receiver until an equivalent code rate is less than one.

32. The wireless communications system of claim 30, wherein said transmitter is capable of forwarding a plurality of the modulated subsequences to the receiver even when said transmitter fails to receive an acknowledgment signal from the receiver.

33. The wireless communications system of claim 30, wherein said transmitter is capable of forwarding one of the modulated subsequences only after said transmitter receives an acknowledgment signal from the receiver.

34. A transmitter comprising:

a coding circuit for coding a digital data block and generating a mother code word;

a reordering circuit for reordering the mother code word according to an ordering vector based on at least one puncturing pattern and generating a reordered mother code word, wherein the ordering vector defines an order in which bits forming the reordered mother code word are to be modulated and forwarded to a receiver; and a modulating circuit for modulating at least one subsequence from the reordered mother code word and forwarding the at least one modulated subsequence to the receiver using at least one fixed net rate channel, wherein said at least one subsequence has as many bits as needed to obtain a desired code rate in view of at least one quality of service requirement.

* * * * *